United States Patent
Luo et al.

(10) Patent No.: US 12,085,846 B2
(45) Date of Patent: Sep. 10, 2024

(54) METHOD FOR INVERSE OPTICAL PROXIMITY CORRECTION OF SUPER-RESOLUTION LITHOGRAPHY BASED ON LEVEL SET ALGORITHM

(71) Applicant: THE INSTITUTE OF OPTICS AND ELECTRONICS, THE CHINESE ACADEMY OF SCIENCES, Sichuan (CN)

(72) Inventors: Xiangang Luo, Sichuan (CN); Weijie Kong, Sichuan (CN); Xiangzhi Liu, Sichuan (CN); Ge Yin, Sichuan (CN); Changtao Wang, Sichuan (CN)

(73) Assignee: THE INSTITUTE OF OPTICS AND ELECTRONICS, THE CHINESE ACADEMY OF SCIENCES, Sichuan (CN)

( * ) Notice: Subject to any disclaimer, the term of this patent is extended or adjusted under 35 U.S.C. 154(b) by 0 days.

(21) Appl. No.: 18/575,736

(22) PCT Filed: Dec. 28, 2021

(86) PCT No.: PCT/CN2021/142023
§ 371 (c)(1),
(2) Date: Dec. 29, 2023

(87) PCT Pub. No.: WO2023/115611
PCT Pub. Date: Jun. 29, 2023

(65) Prior Publication Data
US 2024/0264521 A1    Aug. 8, 2024

(30) Foreign Application Priority Data
Dec. 23, 2021   (CN) .......................... 202111594444.9

(51) Int. Cl.
*G03F 1/36*    (2012.01)
*G03F 7/00*    (2006.01)

(52) U.S. Cl.
CPC ............ *G03F 1/36* (2013.01); *G03F 7/70441* (2013.01)

(58) Field of Classification Search
CPC ............................... G03F 1/36; G03F 7/70441
USPC ............................................................ 430/5
See application file for complete search history.

(56) References Cited

U.S. PATENT DOCUMENTS

| 5,674,646 A | 10/1997 | Kawabata et al. |
| 2003/0140330 A1 | 7/2003 | Tanaka et al. |
| 2014/0123084 A1 | 5/2014 | Tang et al. |

FOREIGN PATENT DOCUMENTS

| CN | 101297390 A | 10/2008 |
| CN | 105573066 A | 2/2016 |
| CN | 107908071 A | 4/2018 |
| CN | 109212912 A | 1/2019 |
| CN | 109976087 A | 7/2019 |
| CN | 110456617 A | 11/2019 |
| CN | 111027110 A | 4/2020 |
| CN | 112363371 A | 2/2021 |
| CN | 112485976 A | 3/2021 |
| CN | 112731757 A | 4/2021 |
| CN | 113359385 A | 9/2021 |
| CN | 113495425 A | 10/2021 |

OTHER PUBLICATIONS

WIPO/ISA/CNIPA, International Search Report and Written Opinion issued on Sep. 22, 2022 in PCT/CN2021/142023, 8 pages.
CNIPA, Notification to Grant Patent Right for Invention of priority application CN202111594444.9, Mar. 28, 2023, 1 page.
Lv, W et al. "Level-set-based inverse lithography for mask synthesis using the conjugate gradient and an optimal time step", J. Vac. Sci. Technol. B Jul. 1, 2013; 31(4): 041605-1 to 13.
Wei, Y et al. "Optical Proximity Correction in the Advanced Photolithography", Micronanoelectronic Technology, vol. 15, No. 3, 186-193, Mar. 2014.

*Primary Examiner* — Christopher G Young
(74) *Attorney, Agent, or Firm* — J. Peter Paredes; Amin Wasserman Gurnani LLP

(57) ABSTRACT

Method for inverse optical proximity correction of super-resolution lithography based on level set algorithm is provided, including: obtaining first mask data according to a target pattern, and constructing a level set function; performing forward simulation, so as to obtain an electric field distribution on a photoresist and a first structural vector electric field distribution on a mask; obtaining a photoresist pattern according to the electric field distribution on the photoresist, and calculating an imaging error between the photoresist pattern and the target pattern; performing accompanying simulation, so as to obtain a second structural vector electric field distribution; obtaining a level set gradient by means of performing calculation according to the first structural vector electric field distribution, the second structural vector electric field distribution and the imaging error; and evolving the level set function, performing update to obtain second mask data, and performing iterative calculation until mask data meeting a preset condition is obtained.

12 Claims, 16 Drawing Sheets

METHOD FOR INVERSE OPTICAL PROXIMITY CORRECTION OF SUPER-RESOLUTION LITHOGRAPHY BASED ON LEVEL SET ALGORITHM

CROSS-REFERENCE TO RELATED APPLICATIONS

The present application claims priority to PCT application serial no. PCT/CN2021/142023 filed Dec. 28, 2021, which claims the priority to the Chinese patent application with the filing No. 202111594444.9 filed on Dec. 23, 2021, the contents of which are incorporated herein by reference in their entireties.

TECHNICAL FIELD

The present disclosure relates to the technical field of integrated circuits, in particular to a method and system for inverse optical proximity correction (OPC) of super-resolution photolithography based on a level set algorithm, an electronic device, a computer-readable storage medium, a program product, and a surface plasmon super-resolution photolithography method.

BACKGROUND ART

As the feature size of very-large-scale integration (VLSI) circuit is getting smaller and smaller, the requirement for resolution of micro-nano manufacturing technology is getting higher and higher. The imaging photolithography resolution of traditional DUV projection photolithography technology has reached 65 nm, and the photolithography resolution can reach 38 nm by means of liquid immersion. In order to further enhance the resolution of imaging photolithography, besides increasing the numerical aperture of imaging objective, it can only be achieved by shortening the wavelength of exposure light source. At present, the EUV photolithography technology with an exposure wavelength of 13.5 nm has become the mainstream photolithography technology, and the resolution of imaging photolithography has been compressed to 16 nm. However, the application cost of this technology has risen sharply due to the expensive and complicated EUV light source, and it is difficult to be promoted on a large scale. Whether for the DUV photolithography technology or for the EUV photolithography technology, due to the limitation of diffraction limit, the photolithography resolution can only reach the order of half a wavelength, and the traditional technical route of photolithography in which the photolithography resolution is improved by shortening the wavelength is unsustainable.

The surface plasmon (SP) super-resolution photolithography technology uses a negative refraction super lens to achieve nano-scale photolithography resolution, which can achieve photolithography resolution far less than half a wavelength at a long wavelength, breaking the bottleneck of traditional resolution diffraction limit, and greatly extending the room for resolution improvement under a long wavelength light source. This not only can break through the current development dilemma of optical photolithography technology and establish a low-cost, high-efficiency and large-area nano-photolithography method, but also has great significance for promoting the development of integrated circuit industry and meeting the urgent demand for micro-nano processing technology in modern science and technology.

When the feature size of the integrated circuit is close to or smaller than the diffraction limit of the photolithography imaging system, after the pattern exposure transfer is performed, there will be serious optical proximity effects (OPEs), such as line end indentation, corner rounding, uneven line width, etc., which will eventually affect the functions or characteristics of the integrated circuit, make the product unable to meet the design requirements, and reduce the yield of the chips. Therefore, in order to reduce the optical proximity effects, various resolution enhancement techniques (RETs) have been proposed. Among them, because of the flexibility in design, the inverse photolithography technology (ILT) is widely used for optical proximity correction, mainly by establishing the imaging mathematical model of the photolithography system and changing the pattern of the mask to compensate the distortion of the output pattern. Since the imaging process of surface plasmon super-resolution photolithography involves the regulation of high spatial frequency evanescent waves, it is difficult to obtain a more accurate imaging model through approximation, so that the traditional inverse OPC method based on an analytical imaging model is difficult to be applied to the surface plasmon super-resolution photolithography.

Since the inverse photolithography technology (also known as inversion lithography) is based on pixels, the degree of freedom of mask optimization will be significantly improved, and the calculation amount and time will also be greatly increased. Therefore, an efficient, fast and low-cost inverse OPC technology is urgently needed to meet the requirement of error between the exposure transfer pattern and the target pattern.

SUMMARY

(I) Technical Problems to be Solved

In view of the above problems, the present disclosure provides a method and system for inverse optical proximity correction of super-resolution photolithography based on a level set algorithm, an electronic device, a computer-readable storage medium, a program product, and a surface plasmon super-resolution photolithography method, so as to solve the technical problems such as the difficulty of applying the traditional inverse OPC method to the surface plasmon super-resolution photolithography and the large calculation amount of the inverse photolithography technology.

(2) Technical Solutions

One aspect of the present disclosure provides a method for inverse optical proximity correction of super-resolution photolithography based on a level set algorithm, which includes: S11, obtaining a first mask data according to a target pattern, and constructing a level set function according to the first mask data; S12, performing forward simulation according to the first mask data and a condition of surface plasmon super-resolution photolithography to obtain electric field distribution on a photoresist and first structural vector electric field distribution on a mask; S13, obtaining a photoresist pattern according to the electric field distribution on the photoresist, and calculating an imaging error between the photoresist pattern and the target pattern; S14, performing adjoint simulation on the first mask data on the basis of the forward simulation to obtain a second structural vector electric field distribution; S15, calculating a level set gradient according to the first structural vector electric field distribution, the second structural vector electric field distribution and the imaging error; and S16, evolving the level set function by using the level set gradient, and updating to obtain a second mask data, and repeating S12 to S16 for iterative calculation by using the second mask data until a mask data meeting a preset condition is obtained, thus completing the inverse optical proximity correction.

Further, obtaining a first mask data according to a target pattern, and constructing a level set function according to the first mask data in S11 includes: obtaining an initial mask pattern according to the target pattern; performing pixelation processing on the initial mask pattern to obtain the first mask data; and constructing the level set function according to the first mask data.

Further, constructing the level set function according to the first mask data includes: constructing the level set function $\phi(x, y)$ by using the following formula:

$$\phi(x, y) = \begin{cases} -d(x, y), & x, y \in M^- \\ 0, & x, y \in \partial M \\ d(x, y), & x, y \in M^+ \end{cases}$$

where d(x, y) represents a distance from a certain point (x, y) on a mask pattern to a boundary of the mask pattern, x, y represent a coordinate value of a certain point, $M^-$ represents an area inside the mask pattern M, $\partial M$ represents the boundary of the mask pattern M, and $M^+$ represents an area outside the mask pattern M, wherein the mask pattern M is the mask pattern corresponding to the first mask data.

Further, performing forward simulation according to the first mask data and a condition of surface plasmon super-resolution photolithography in S12 includes: performing the forward simulation by using an exposure light source as an excitation source; and calculating the electric field distribution on the photoresist and the first structural vector electric field distribution on the mask.

Further, calculating an imaging error between the photoresist pattern and the target pattern in S13 includes: obtaining a light intensity distribution according to the electric field distribution on the photoresist, and obtaining the photoresist pattern according to the light intensity distribution; calculating the imaging error between the photoresist pattern and the target pattern; and determining whether the imaging error is less than a preset error threshold and whether a current cumulative number of iterations is greater than a preset number of iterations, where if the imaging error is less than the preset error threshold or the current cumulative number of iterations is greater than the preset number of iterations, current mask data is the mask data meeting the preset condition, and the inverse optical proximity correction is completed; otherwise, the iterative calculation is continued.

Further, calculating an imaging error between the photoresist pattern and the target pattern in S13 includes: calculating the imaging error F by using the following formula:

$$F = \|Z - Z_d\|_2^2$$

where $Z_d$ is the target pattern, Z is the photoresist pattern, and $\|\cdot\|_2$ represents a L-2 norm.

Further, if the imaging error is less than the preset error threshold or the current cumulative number of iterations is greater than the preset number of iterations, the method further includes: taking the current mask data as the mask data for completing the inverse optical proximity correction, and outputting a final mask pattern.

Further, performing adjoint simulation on the first mask data on the basis of the forward simulation in S14 includes: obtaining an adjoint source of the adjoint simulation according to the electric field distribution on the photoresist; and performing the adjoint simulation on the first mask data according to the adjoint source to obtain the second structural vector electric field distribution.

Further, calculating a level set gradient according to the first structural vector electric field distribution the second structural vector electric field distribution and the imaging error in S15 includes: calculating the level set gradient $$\frac{\partial F}{\partial M}$$

by using the following formula:

$$\frac{\partial F}{\partial M} = 2\text{Re}\left[(\varepsilon_2 - \varepsilon_1)E_\|(x', y')E_\|^A(x', y') + \left(\frac{1}{\varepsilon_1} - \frac{1}{\varepsilon_2}\right)D_\perp(x', y')D_\perp^A(x', y')\right]$$

wherein $\varepsilon_1$ and $\varepsilon_2$ are dielectric constants of a mask base material and a mask pattern structure filling material, respectively, $E_\|(x', y')$ and $E_\|^A(x', y')$ are tangential components of electric fields of the forward simulation and the adjoint simulation, respectively, $D_\perp(x', y')$ and $D_\perp^A(x', y')$ are normal components of electric displacement vectors of the forward simulation and the adjoint simulation, respectively, and $$\frac{\partial F}{\partial M}$$

is a gradient of the imaging error F relative to the mask pattern M, where the mask pattern M is the mask pattern corresponding to the first mask data or a current mask data.

Further, evolving the level set function by using the level set gradient in S16 includes: evolving the level set function by using the following formula to obtain an updated level set function:

$$\frac{\partial \phi}{\partial t} = -\alpha \cdot |\nabla \phi|$$

where $$\alpha = \frac{\partial F}{\partial M},$$

and $\alpha$ is the level set gradient; updating the current mask data to obtain the second mask data according to the updated level set function; repeating S12 to S16 by using the second mask data for iterative calculation, wherein the level set function used in S16 is the updated level set function obtained in the last iteration.

Another aspect of the present disclosure provides a surface plasmon super-resolution photolithography method, which includes: S21, obtaining a first mask data according to a target pattern, and constructing a level set function according to the first mask data; S22, performing forward simulation according to the first mask data and a condition of surface plasmon super-resolution photolithography to obtain electric field distribution on a photoresist and first structural vector electric field distribution on a mask; S23, obtaining a photoresist pattern according to the electric field distribution on the photoresist, and calculating an imaging error between the photoresist pattern and the target pattern; S24, performing adjoint simulation on the first mask data on the basis of the forward simulation to obtain a second structural vector electric field distribution; S25, calculating a level set gradient according to the first structural vector electric field distribution, the second structural vector electric field distribution and the imaging error; S26, evolving the level set function by using the level set gradient, and updating to obtain a second mask data, and repeating S22 to S26 for iterative calculation by using the second mask data until a mask data meeting a preset condition is obtained, thus completing the inverse optical proximity correction, and outputting the final mask pattern; and S27, performing the surface plasmon super-resolution photolithography according to the final mask pattern.

Yet another aspect of the present disclosure provides a system for inverse optical proximity correction of super-resolution photolithography based on a level set algorithm, which includes: a level set function processing module, configured for obtaining a first mask data according to a target pattern, and constructing a level set function according to the first mask data; a forward simulation module, configured for performing forward simulation according to the first mask data and a condition of surface plasmon super-resolution photolithography to obtain electric field distribution on a photoresist and first structural vector electric field distribution on a mask; an error calculation module, configured for obtaining a photoresist pattern according to the electric field distribution on the photoresist, and calculating an imaging error between the photoresist pattern and the target pattern; an adjoint simulation module, configured for performing adjoint simulation on the first mask data on the basis of the forward simulation to obtain a second structural vector electric field distribution; a level set gradient calculation module, configured for calculating a level set gradient according to the first structural vector electric field distribution, the second structural vector electric field distribution and the imaging error; and an evolution module, configured for evolving the level set function by using the level set gradient, and updating to obtain a second mask data, and performing iterative calculation by using the second mask data until a mask data meeting a preset condition is obtained, thus completing the inverse optical proximity correction. Still another aspect of the present disclosure provides an electronic device, which includes a memory, a processor and a computer program stored in the memory and executable by the processor, where the computer program, when executed by the processor executes, causes the processor to perform the method for inverse optical proximity correction of super-resolution photolithography based on a level set algorithm.

Still another aspect of the present disclosure provides a computer-readable storage medium, storing a computer program thereon, where the computer program, when executed by a processor, implements the method for inverse optical proximity correction of super-resolution photolithography based on a level set algorithm.

Still another aspect of the present disclosure provides a computer program product, including a computer program which, where the computer program, when executed by a processor, implements the method for inverse optical proximity correction of super-resolution photolithography based on a level set algorithm.

(III) Beneficial Effects

The present disclosure provides a method and system for inverse optical proximity correction of super-resolution photolithography based on a level set algorithm, an electronic device, a computer-readable storage medium, a program product, and a surface plasmon super-resolution photolithography method. Through forward simulation and adjoint simulation, the level set gradient update information of a mask region is obtained, and the level set function is evolved through the update information to obtain updated mask data, and the mask pattern corresponding to the low-distortion photoresist pattern can be obtained through repeated iterations. In the process of mask optimization, the level set algorithm in which only the boundary of the mask instead of the three-dimensional distribution of the optical parameters of the mask structure is changed is used, which significantly reduces the calculation amount and operation time, and can implement the rapid inverse optical proximity correction. In the level set algorithm, the gradient of mask boundary movement is obtained by structural vector electric field distribution from forward simulation and adjoint simulation, which gets rid of the serious dependence of inverse OPC on the analytical model of imaging photolithography.

BRIEF DESCRIPTION OF DRAWINGS

For a more complete understanding of the present disclosure and its advantages, reference will now be made to the following description taken in conjunction with the accompanying drawings, in which.

DETAILED DESCRIPTION OF EMBODIMENTS

Figure 1:
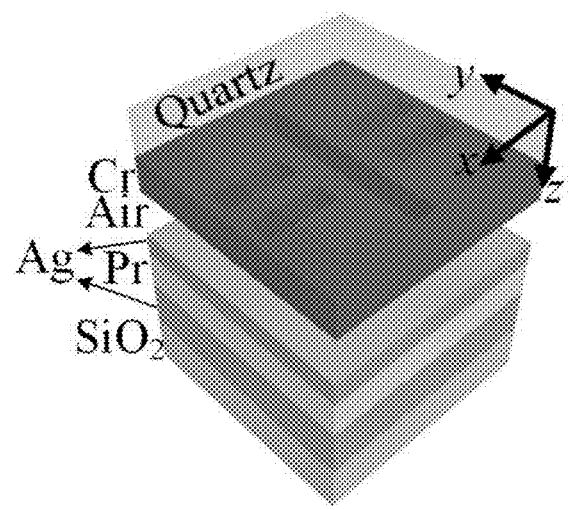
FIG. 1 schematically shows an application scenario of a method for inverse optical proximity correction of super-resolution photolithography based on a level set algorithm according to an embodiment of the present disclosure.

Hereinafter, embodiments of the present disclosure will be described with reference to the accompanying drawings. However, it should be understood that the description are only exemplary and are not intended to limit the scope of the present disclosure. In the following detailed description, for the convenience of interpretation, numerous specific details are set forth to provide a comprehensive understanding of the embodiments of the present disclosure. However, it is clear that one or more embodiments may be implemented without these specific details. In addition, in the following, description of publicly known structures and technologies are omitted to avoid unnecessarily confusing the concepts of the present disclosure.

The terms used herein is for the purpose of describing specific embodiments only and is not intended to limit the present disclosure. The terms "include", "contain", etc. used herein indicate the presence of the stated features, steps, operations and/or components, but do not exclude the presence or addition of one or more other features, steps, operations or components.

All terms (including technical and scientific terms) used herein have the meanings commonly understood by those skilled in the art, unless otherwise defined. It should be noted that the terms used here should be interpreted as having meanings consistent with the context of this specification, and should not be interpreted in an idealized or overly rigid way.

Some block diagrams and/or flowcharts are shown in the drawings. It should be understood that some blocks or combinations of the blocks in the block diagrams and/or flowcharts may be implemented by computer program instructions. These computer program instructions may be provided to a processor of a general-purpose computer, a special-purpose computer or another programmable data processing apparatus, so that when executed by the processor, these instructions may create an apparatus for implementing the functions/operations specified in the block diagrams and/or flowcharts. The technology of the present disclosure may be implemented in the form of hardware and/or software (including firmware, microcode, etc.). In addition, the technology of the present disclosure may take the form of a computer program product on a computer-readable storage medium storing instructions, which may be used by or in combination with an instruction execution system.

In the present disclosure, for the convenience of description, only the target pattern, the initial mask pattern, the mask pattern and the final mask pattern are called patterns, while the results obtained in the calculation process and the imaging process in the inverse optical proximity correction are called data. It can be understood that the data in the processes can output corresponding patterns.

FIG. 1 schematically shows an application scenario diagram to which the method for inverse optical proximity correction of super-resolution photolithography based on a level set algorithm can be applied according to an embodiment of the present disclosure. It should be noted that FIG. 1 is only an example of an application scenario to which the embodiments of the present disclosure can be applied, to help those skilled in the art understand the technical content of the present disclosure, but it does not mean that the embodiments of the present disclosure cannot be used in other devices, systems, environments or scenarios.

The surface plasmon super-resolution photolithography structure of the embodiment of the present disclosure may, as shown in FIG. 1, include a structure of a mask (quartz+Cr), an air spacer layer (Air), a metal layer (Ag), a photoresist (Pr), a metal reflective layer (Ag) and a substrate ($SiO_2$); or the surface plasmon super-resolution photolithography structure may further include: a mask, a multilayer film structure, an air spacer layer, a photoresist and a substrate structure; a mask, a multilayer film structure, an air space layer, a metal transmission layer, a photoresist and a substrate; a mask, a multilayer film structure, an air space layer, a photoresist, a metal reflect layer, a substrate, and other structures; a mask, a multilayer film structure, an air spacer layer, a metal transmission layer, a photoresist, a metal reflection layer, and other structures. The present disclosure has good applicability to the surface plasmon super-resolution photolithography system.

Based on the problems existing in the prior art, the present disclosure adopts the level set algorithm, in which a zero level set is used to represent the outline of the mask pattern, the light field intensity distribution in the photoresist is modulated by changing the outline of the mask pattern, and analysis of imaging model and the process of binarization optimization of mask data are not needed, so that the fidelity of a photolithography pattern is improved and the efficiency of inverse OPC is significantly improved.

Figure 2:
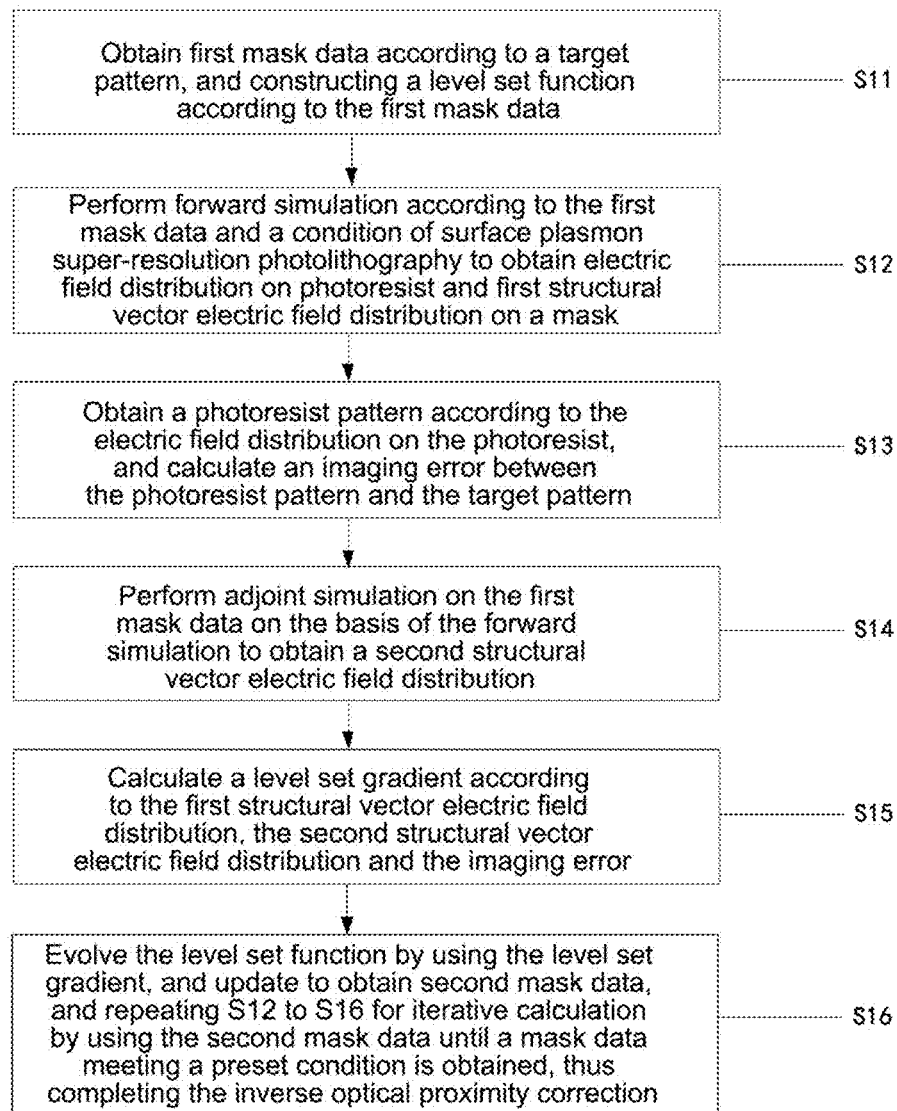
FIG. 2 schematically shows a flowchart of the method for inverse optical proximity correction of super-resolution photolithography based on a level set algorithm according to an embodiment of the present disclosure.

FIG. 2 schematically shows a flowchart of a method for inverse optical proximity correction of super-resolution photolithography based on a level set algorithm according to an embodiment of the present disclosure.

As shown in FIG. 2, the method for inverse optical proximity correction of super-resolution photolithography based on a level set algorithm includes the following operations S11 to S16.

Operation S11: obtaining first mask data according to a target pattern, and constructing a level set function according to the first mask data.

The first mask data is the initial mask data obtained according to the target pattern, where the first mask data is only used as the input of operation S11, and the first mask data mentioned in operations S12 to S15 all refer to the current mask data in the iterative process. The process of mask pattern optimization may be regarded as a constant evolution process of the boundary of the mask pattern, so the level set function is used to represent the mask pattern, and the zero level set is used to represent the boundary of the mask pattern.

The level set algorithm is a numerical technique for interface tracking and shape modeling, which represents the change of boundary through a higher-dimensional function, and has a high degree of freedom and flexibility. According to the present disclosure, the inverse OPC technology based on the level set algorithm modulates the intensity distribution of the light field in the photoresist by changing the boundary shape of the mask, without need for the process of binarization optimization of continuous mask data and analysis of imaging model, so that the fidelity of the photolithography pattern is improved and the efficiency of inverse OPC is significantly improved.

Operation S12: performing forward simulation according to the first mask data and a condition of surface plasmon super-resolution photolithography to obtain electric field distribution on photoresist and first structural vector electric field distribution on a mask.

The forward simulation is to image the mask pattern under the illumination of the exposure light source as the excitation source through the structural conditions of surface plasmon super-resolution photolithography. The mask pattern is the pattern corresponding to the first mask data, the electric field distribution of the spatial image is obtained on the photoresist, the first structural vector electric field distribution is obtained in the mask area, and the mask area represents the three-dimensional structural area where the mask pattern is located.

The structure of surface plasmon super-resolution photolithography may be, for example, the structure shown in FIG. 1, including a mask (quartz+Cr), an air spacer layer (Air), a metal layer (Ag), a photoresist (Pr), a metal reflective layer (Ag) and a substrate ($SiO_2$).

Operation S13: obtaining a photoresist pattern according to the electric field distribution on the photoresist, and calculating an imaging error between the photoresist pattern and the target pattern.

Through the electric field distribution on the photoresist, the photoresist pattern is output by using the photoresist model, and the function value of pattern error between the photoresist pattern and the target pattern, that is, the imaging error, is calculated.

Operation S14: performing adjoint simulation on the first mask data on the basis of the forward simulation to obtain a second structural vector electric field distribution.

The adjoint simulation is to replace the imaging monitor in the photoresist with a specific adjoint source on the basis of forward simulation. The adjoint source may be intuitively understood as performing inverse transmission of the conjugate field on the expected output field, thereby monitoring the second structural vector electric field in the mask area. In steps S12 and S14, the forward simulation and the adjoint simulation may be calculated by finite difference time domain (FDTD), rigorous coupled-wave analysis (RCWA), finite element modeling (FEM) and other methods.

Operation S15: calculating a level set gradient according to the first structural vector electric field distribution, the second structural vector electric field distribution and the imaging error.

Combining the first structural vector electric field of forward simulation obtained in operation S12 and the second structural vector electric field of adjoint simulation obtained in S13, and according to Maxwell boundary conditions, that is, the electric field is continuous in the tangential direction of the boundary and the electric displacement vector is continuous in the normal direction of the boundary, the gradient of imaging error relative to the mask pattern, that is, the level set gradient, is calculated.

Operation S16: evolving the level set function by using the level set gradient, and updating to obtain a second mask data, and repeating S12 to S16 for iterative calculation by using the second mask data until a mask data meeting a preset condition is obtained, thus completing the inverse optical proximity correction.

The level set function is evolved according to the level set gradient obtained in operation S15, and the mask data is updated on the basis of the evolved level set function. Operations S12 to S16 are repeated until the imaging error in operation S13 meets the design index or the number of iterations reaches the maximum number of iterations. For a typical circuit pattern, the present disclosure only needs 30 to 50 iterations to compress the function value of pattern error to the optimal value.

Based on the reciprocity of Green's function, the method for inverse OPC of surface plasmon super-resolution photolithography based on a level set algorithm in the present disclosure only needs two simulations to obtain the level set gradient update information of the mask area, and the light field intensity distribution in the photoresist is modulated by changing the boundary shape of the mask, thus improving the fidelity of the photolithography pattern. Since the inverse OPC technology based on a level set algorithm is to change the mask boundary, the process of binarization optimization of continuous mask is not needed, and only a small number of iteratives for optimization can meet the OPC requirement, which significantly reduces the calculation amount and operation time, and improves the optimization speed.

Figure 3:
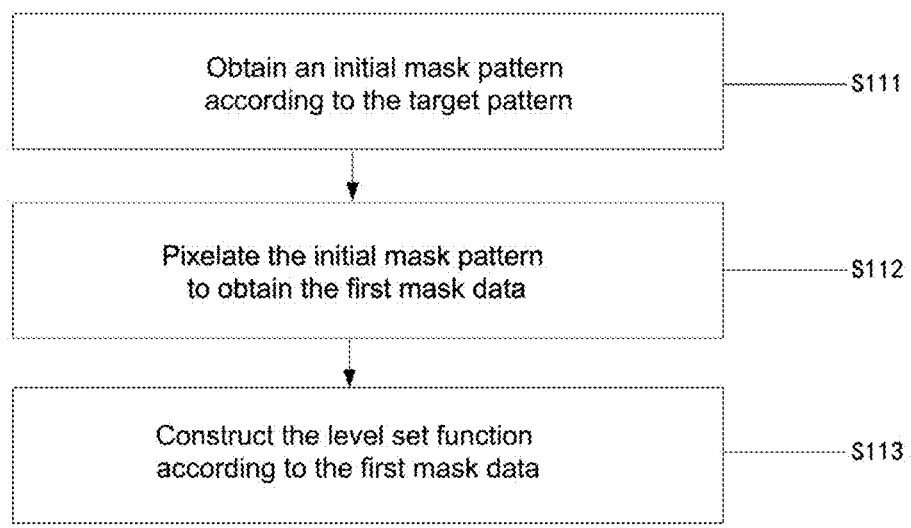
FIG. 3 schematically shows a flowchart of a method for obtaining first mask data according to a target pattern and constructing the level set function according to the first mask data according to an embodiment of the present disclosure.

FIG. 3 schematically shows a flowchart of a method for obtaining first mask data according to a target pattern and constructing the level set function according to the first mask data in S11 according to an embodiment of the present disclosure.

As shown in FIG. 3, the method for obtaining first mask data according to a target pattern and constructing the level set function according to the first mask data includes:

operation S111: obtaining an initial mask pattern according to the target pattern;

operation S112: performing pixelation processing on the initial mask pattern to obtain the first mask data; and operation S113: constructing the level set function according to the first mask data.

The target pattern is input as the initial mask pattern, then the initial mask pattern is pixelated, and the value of each pixel is 0 or 1, where 0 means an opaque mask and 1 means a transparent mask, that is, the initial mask pattern is transformed into a binary matrix, the first mask data is binary mask matrix data, and a level set function is constructed according to the first mask data. Herein, the ideal image that is finally imaged is the target pattern.

On the basis of the above embodiment, constructing the level set function according to the first mask data includes: constructing the level set function $\phi(x, y)$ by using the following formula:

$$\phi(x, y) = \begin{cases} -d(x, y), & x, y \in M^- \\ 0, & x, y \in \partial M \\ d(x, y), & x, y \in M^+ \end{cases}$$

where d(x, y) represents a distance from a certain point (x, y) on the mask pattern to a boundary of the mask pattern, x, y represent a coordinate value of a certain point, $M^-$ represents an area inside the mask pattern M, $\partial M$ represents the boundary of the mask pattern M, and $M^+$ represents an area outside the mask pattern M, wherein the mask pattern M is the mask pattern corresponding to the first mask data.

The optimization process of the mask may be regarded as a process in which the topological structure of its boundary pattern is constantly evolved, so that the level set function is used to represent the mask pattern.

Figure 4:
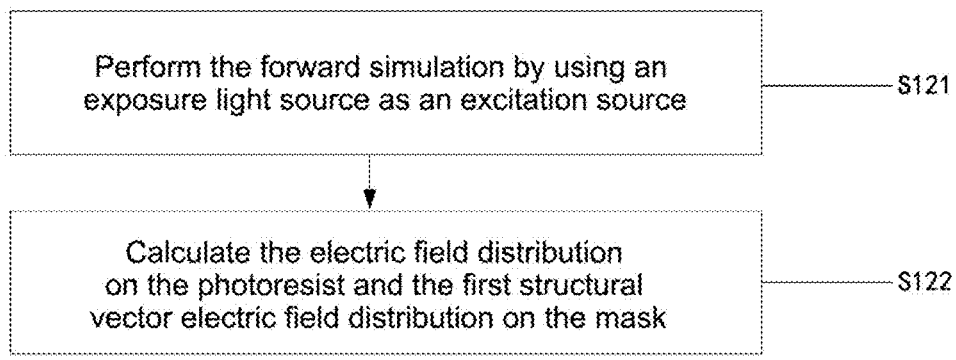
FIG. 4 schematically shows a flowchart of a method for performing forward simulation according to the first mask data and a condition of surface plasmon super-resolution photolithography according to an embodiment of the present disclosure.

FIG. 4 schematically shows a flowchart of a method for performing forward simulation according to the first mask data and a condition of surface plasmon super-resolution photolithography in S12 according to an embodiment of the present disclosure.

As shown in FIG. 4, the method for performing forward simulation according to the first mask data and a condition of surface plasmon super-resolution photolithography includes:

operation S121: performing the forward simulation by using an exposure light source as an excitation source; and operation S122: calculating the electric field distribution on the photoresist and the first structural vector electric field distribution on the mask.

The present disclosure is applicable to the optimization of any integrated circuit mask patterns. For complex circuit patterns, unpolarized light source is needed to be used as the excitation source of forward simulation, which is approximately the superposition of two incoherent transverse magnetic (TM) and transverse electric (TE) polarized plane waves. Under the illumination of the exposure light source as the excitation source, the mask pattern is imaged by the surface plasmon super-resolution photolithography system, the electric field distribution of the spatial image is obtained on the photoresist, and the first structural vector electric field distribution is obtained in the mask area. This process is the forward simulation. Specifically, the electric field distribution may be, for example, calculated by using the finite difference time domain method.

Figure 5:
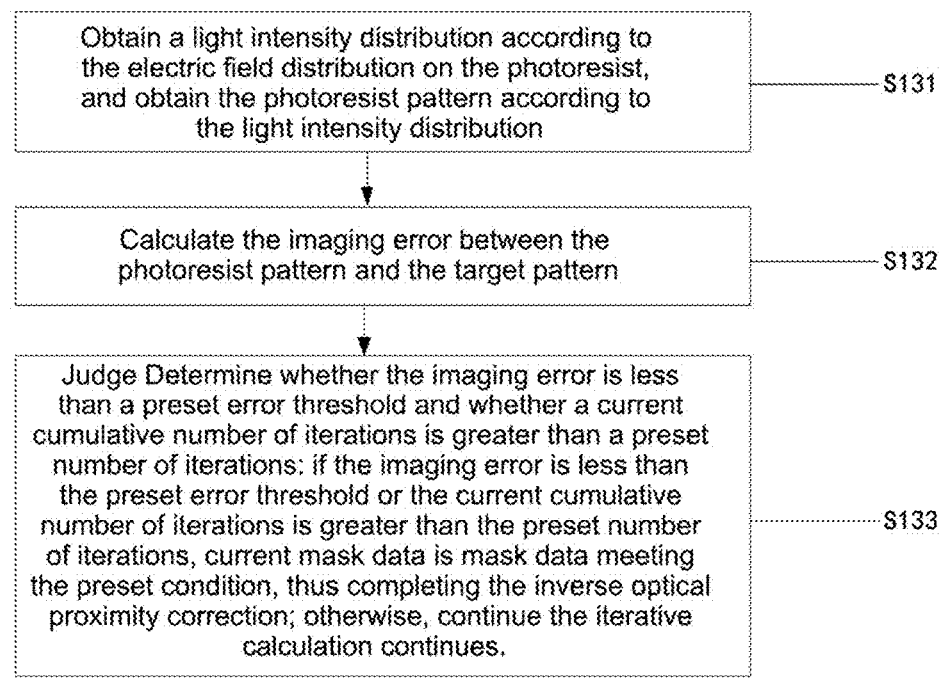
FIG. 5 schematically shows a flowchart of a method for calculating an imaging error between a photoresist pattern and a target pattern according to an embodiment of the present disclosure.

FIG. 5 schematically shows a flowchart of a method for calculating an imaging error between a photoresist pattern and a target pattern in S13 according to an embodiment of the present disclosure.

As shown in FIG. 5, the method for calculating an imaging error between the photoresist pattern and the target pattern includes:

operation S131: obtaining a light intensity distribution according to the electric field distribution on the photoresist, and obtaining the photoresist pattern according to the light intensity distribution;

operation S132: calculating the imaging error between the photoresist pattern and the target pattern; and operation S133: determining whether the imaging error is less than a preset error threshold and whether a current cumulative number of iterations is greater than a preset number of iterations: if the imaging error is less than the preset error threshold or the current cumulative number of iterations is greater than the preset number of iterations, the current mask data is a mask data meeting the preset condition, thus completing the inverse optical proximity correction; otherwise, the iterative calculation is continued.

When the forward simulation excitation source which is approximately the superposition of two incoherent transverse magnetic (TM) and transverse electric (TE) polarized plane waves is used, the light intensity of the spatial image in the photoresist layer is $$I(x, y) = \frac{1}{2}\left(|E_{TE}(x, y)|^2 + |E_{TM}(x, y)|^2\right).$$

The binary exposure transfer pattern is obtained through the photoresist model and the photoresist pattern is output, and the imaging error between the output photoresist pattern and the target pattern is calculated.

It is determined whether the imaging error is within a preset error threshold, or the number of iterations is greater than the preset number of iterations. When the function value of pattern error is less than the error threshold or the number of iterations is greater than the preset number of iterations, the current mask data is taken as the mask data meeting the preset conditions to complete the inverse optical proximity correction; otherwise, go to operation S14 to continue the iterative calculation.

On the basis of the above embodiment, calculating an imaging error between the photoresist pattern and the target pattern in S13 includes: calculating the imaging error F by using the following formula:

$$F=\|Z-Z_d\|_2^2$$

where $Z_d$ is the target pattern, Z is the photoresist pattern, and $\|\cdot\|_2$ represents a L-2 norm.

The imaging error F is defined as the square of the L-2 norm of the difference between the target pattern and the corresponding output photoresist pattern of the current mask pattern. The imaging error is used in the present disclosure to evaluate the quality of mask imaging, and its size is closely related to parameters such as mask pattern shape, mask size and pixel size. The smaller the value of imaging error, the better the mask imaging quality. For example, the threshold value of imaging error in the present disclosure may be set to 10. Certainly, the present disclosure may also adopt other error calculation methods, not limited to the above methods.

On the basis of the above embodiment, if the imaging error is less than the preset error threshold or the current cumulative number of iterations is greater than the preset number of iterations, the method further includes: taking the current mask data as the mask data for completing the inverse optical proximity correction, and outputting a final mask pattern.

When the imaging error is less than the preset error threshold or the current cumulative number of iterations is greater than the preset number of iterations, the current mask data is considered to be the optimized mask data, the step of the inverse optical proximity correction is completed, and the final mask pattern is output according to the current mask data.

Figure 6:
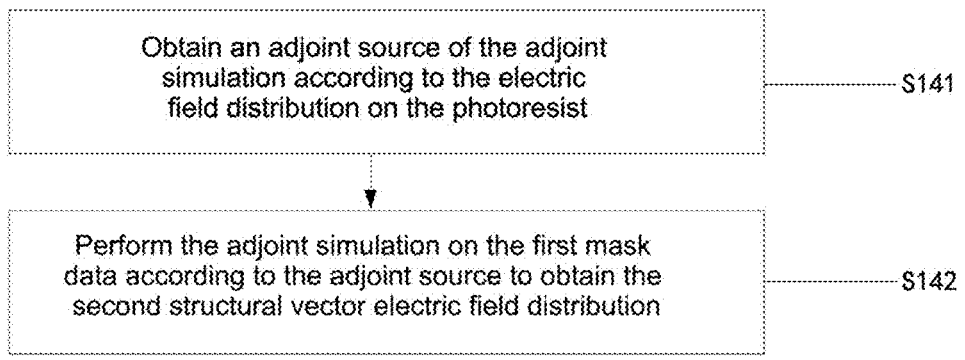
FIG. 6 schematically shows a flowchart of a method for performing adjoint simulation on first mask data on the basis of forward simulation according to an embodiment of the present disclosure.

FIG. 6 schematically shows a flowchart of a method for performing adjoint simulation on the first mask data on the basis of the forward simulation in S14 according to an embodiment of the present disclosure.

As shown in FIG. 6, the method for performing adjoint simulation on the first mask data on the basis of the forward simulation includes:

operation S141: obtaining an adjoint source of the adjoint simulation according to the electric field distribution on the photoresist; and operation S142: performing the adjoint simulation on the first mask data according to the adjoint source to obtain the second structural vector electric field distribution.

According to the electric field distribution in the forward simulation photoresist, the adjoint sources a·(Z–$Z_d$)·Z·(1–Z)·$E_{TE}$* and a·(Z–$Z_d$)·Z·(1–Z)·$E_{TM}$* under TE and TM polarization are obtained respectively, where * represents complex conjugation. The adjoint sources are used to perform adjoint simulation on the mask pattern through the aforementioned surface plasmon super-resolution photolithography system, and the second structural vector electric field distribution in the mask region is obtained by monitoring.

On the basis of the above embodiment, calculating to obtain a level set gradient according to the first structural vector electric field distribution the second structural vector electric field distribution and the imaging error in S15 includes: calculating the level set gradient $$\frac{\partial F}{\partial M}$$

by using the following formula:

$$\frac{\partial F}{\partial M} = 2\text{Re}\left[(\varepsilon_2 - \varepsilon_1)E_\parallel(x', y')E_\parallel^A(x', y') + \left(\frac{1}{\varepsilon_1} - \frac{1}{\varepsilon_2}\right)D_\perp(x', y')D_\perp^A(x', y')\right]$$

wherein $\varepsilon_1$ and $\varepsilon_2$ are dielectric constants of a mask base material and a mask pattern structure filling material, respectively, $E_\parallel(x', y')$ and $E_\parallel^A(x', y')$ are tangential components of electric fields of the forward simulation and the adjoint simulation, respectively, $D_\perp(x', y')$ and $D_\perp^A(x', y')$ are normal components of electric displacement vectors of the forward simulation and the adjoint simulation, respectively, and $$\frac{\partial F}{\partial M}$$

is a gradient of the imaging error F relative to the mask pattern M, wherein the mask pattern M is the mask pattern corresponding to the first mask data or a current mask data.

Combining the first structural vector electric field of the forward simulation in operation S12 and the second structural vector electric field of the adjoint simulation in operation S14, according to Maxwell boundary conditions, that is, the electric field is continuous in the tangential direction of the boundary and the electric displacement vector is continuous in the normal direction of the boundary, the gradient of the imaging error function F relative to the mask pattern M, that is, the level set gradient, is calculated.

Figure 7:
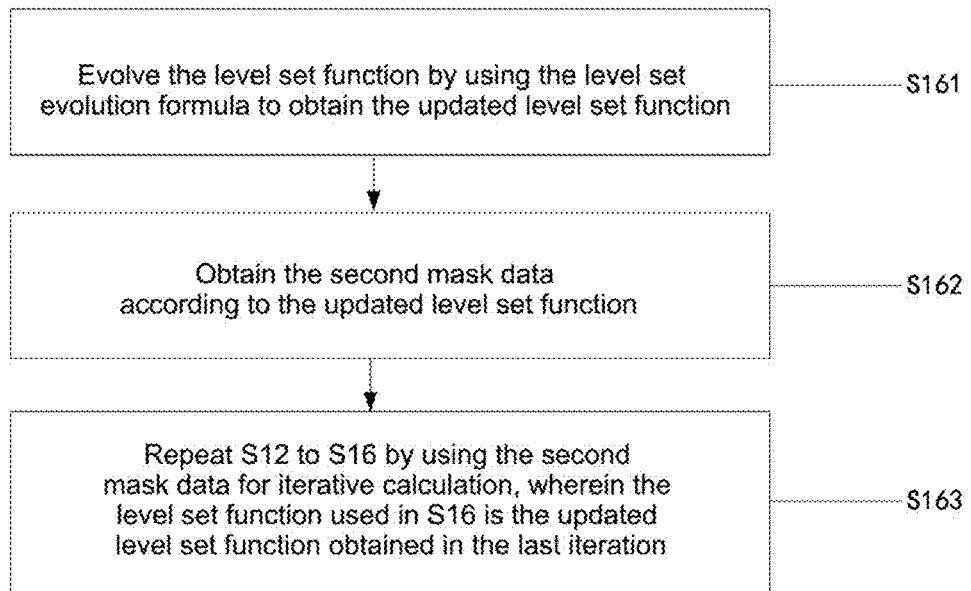
FIG. 7 schematically shows a flowchart of a method for evolving a level set function by using a level set gradient according to an embodiment of the present disclosure.

FIG. 7 schematically shows a flowchart of a method for evolving a level set function using a level set gradient in S16 according to an embodiment of the present disclosure.

As shown in FIG. 7, the method for evolving a level set function by using the level set gradient in S16 includes:

operation S161: calculating the level set function by using the following formula for evolution to obtain an updated level set function:

$$\frac{\partial \phi}{\partial t} = -\alpha \cdot |\nabla \phi|$$

where $$\alpha = \frac{\partial F}{\partial M},$$

and α is the level set gradient;

operation S162: according to the updated level set function, updating the current mask data to obtain second mask data; and operation S163: repeating S12 to S16 for iterative calculation by using the second mask data as the current mask data, wherein the level set function used in S16 is the updated level set function obtained in the last iteration.

According to the above level set evolution formula, the level set function is updated, and according to the updated level set function, the level set function $\phi(x, y)<0$ is a mask pattern area (the pixel value is 1) and $\phi(x, y)>0$ is an opaque area (the pixel value is 0), thereby obtaining the updated binary mask matrix data, that is, the second mask data.

According to the present disclosure, the level set algorithm is used to perform the pixelated evolution of the mask pattern boundary, so as to implement the inverse optical proximity correction suitable for surface plasmon super-resolution photolithography, thereby obtaining the exposure pattern of the nano-scale integrated circuit close to the target pattern on the photoresist layer.

Specifically, the zero level set is used to represent the boundary of the mask pattern, and the level set gradient (that is, the boundary change gradient of the mask pattern) is calculated by using forward simulation and adjoint simulation numerical values. Compared with the inverse OPC method based on topology optimization, there is no need to blur and binarize the mask, the optimization speed is significantly accelerated, and the complexity of the mask obtained after OPC is also significantly reduced. Further, the final mask pattern may be output according to the optimized mask data obtained above, and may be used in the surface plasmon super-resolution photolithography method.

Figure 8:
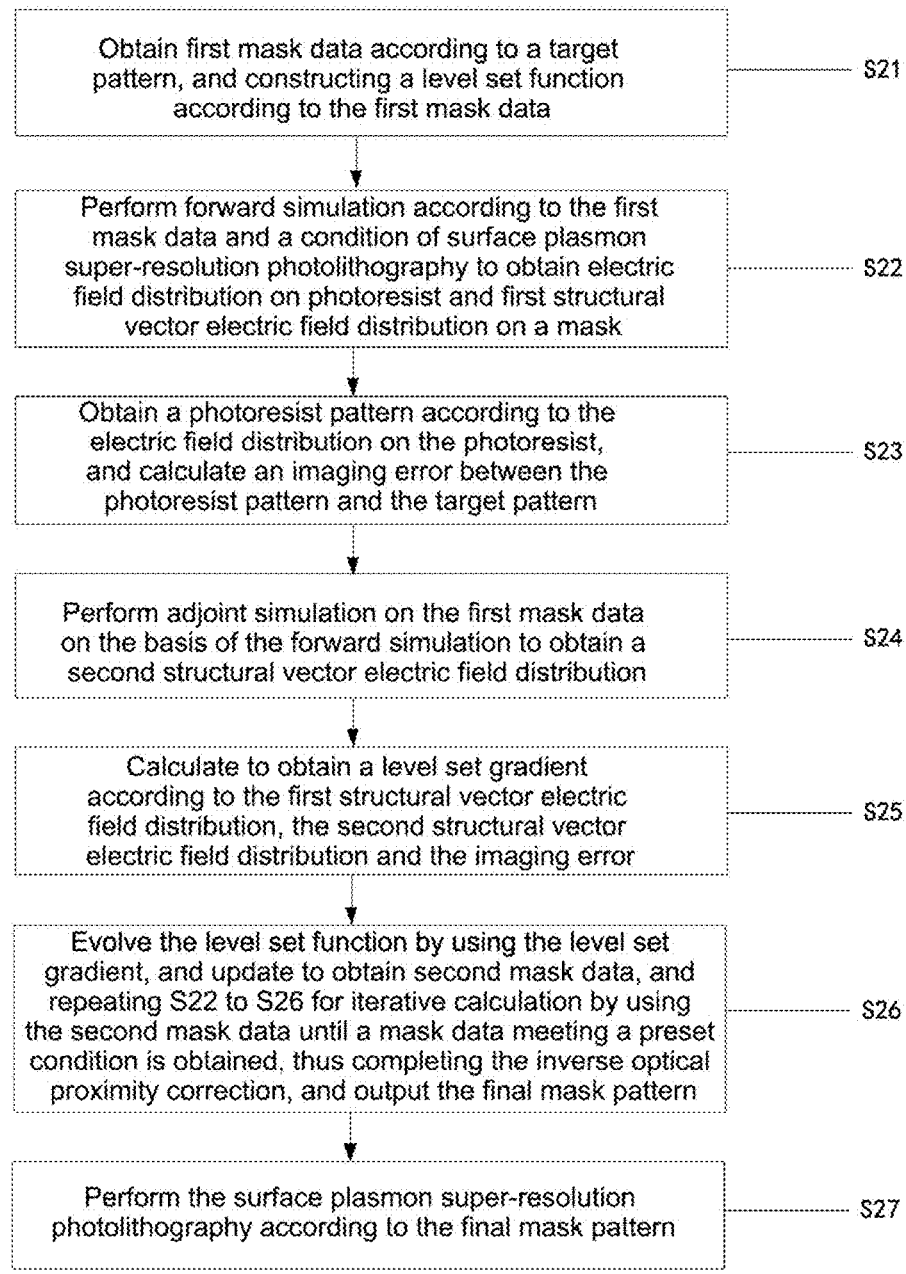
FIG. 8 schematically shows a flowchart of a surface plasmon super-resolution photolithography method according to an embodiment of the present disclosure.

FIG. 8 schematically shows a flowchart of a surface plasmon super-resolution photolithography method according to an embodiment of the present disclosure. The surface plasmon super-resolution photolithography method includes:

S21, obtaining first mask data according to a target pattern, and constructing a level set function according to the first mask data;

S22, performing forward simulation according to the first mask data and a condition of surface plasmon super-resolution photolithography to obtain electric field distribution on photoresist and first structural vector electric field distribution on a mask;

S23, obtaining a photoresist pattern according to the electric field distribution on the photoresist, and calculating an imaging error between the photoresist pattern and the target pattern;

S24, performing adjoint simulation on the first mask data on the basis of the forward simulation to obtain a second structural vector electric field distribution;

S25, calculating to obtain a level set gradient according to the first structural vector electric field distribution, the second structural vector electric field distribution and the imaging error; and S26, evolving a level set function by using the level set gradient, updating to obtain second mask data, and repeating S22 to S26 for iterative calculation by using the second mask data until a mask data meeting a preset condition is obtained, thus completing the inverse optical proximity correction, and outputting the final mask pattern; and S27: performing the surface plasmon super-resolution photolithography according to the final mask pattern.

That is, the final mask pattern is output on the basis of the method for inverse optical proximity correction of super-resolution photolithography based on a level set algorithm, and photolithography is performed according to the final mask pattern.

In the present disclosure, the mask pattern is divided into pixelated grids, and the value of each pixel is 0 or 1, where 0 represents an opaque mask and 1 represents a transparent mask, and the boundary of the transparent region of the mask is taken as an optimization parameter, then the final mask pattern is determined by boundary optimization through the level set. Based on the reciprocity of Green's function, the level set gradient update information in the mask area is obtained by forward simulation and adjoint simulation, and then the light field intensity distribution in the photoresist is modulated by changing the boundary shape of the mask to adjust the outline of the photoresist pattern, thus improving the fidelity of the exposed pattern. Operations S21 to S26 correspond to the aforementioned operations S11 to S16, and will not be repeated here.

Figure 9:
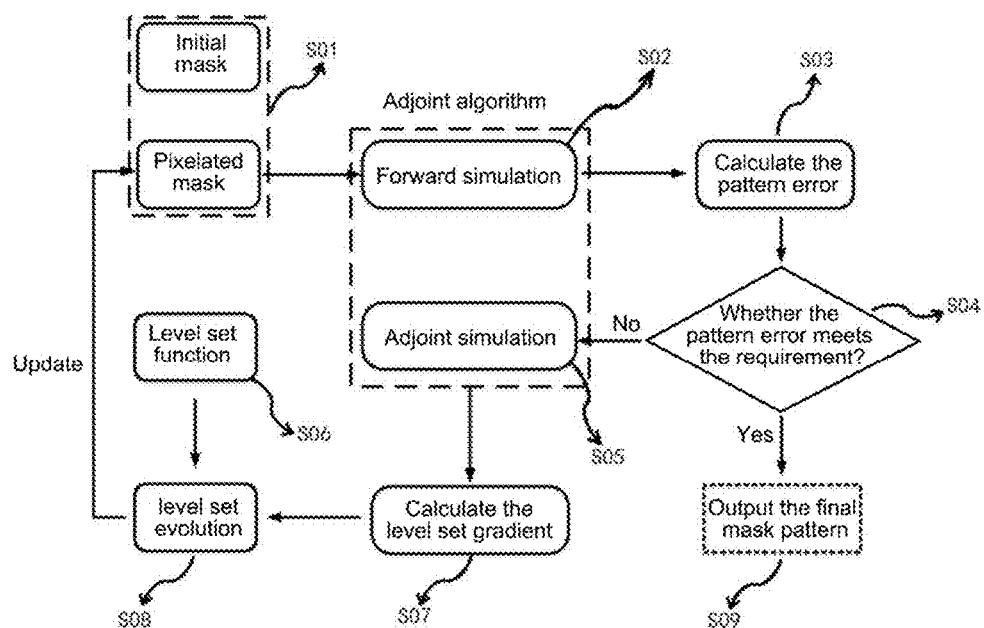
FIG. 9 schematically shows a flowchart of a method for inverse OPC of super-resolution photolithography based on a level set algorithm according to a specific embodiment of the present disclosure.
Figure 10:
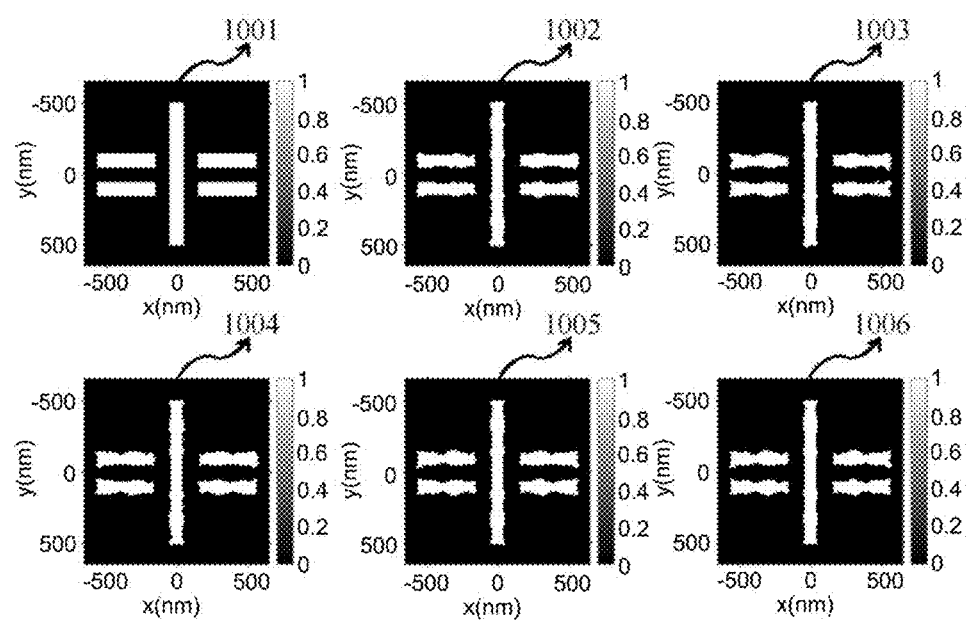
FIG. 10 schematically shows an iterative evolution diagram of a mask pattern in an optimization process according to a specific embodiment of the present disclosure.

Next, each operation step of the present disclosure will be further illustrated with a specific embodiment, and the complete flowchart of the method is shown in FIG. 9.

Specifically, the method of the present disclosure includes the following steps:

Step S01: determining the target pattern $Z_d(x, y)$, meanwhile taking the target pattern as the initial mask pattern M (x, y), wherein in order to conveniently calculate, the mask is divided into m×n pixelated grid, the first mask data is obtained, which is equivalent to the above operations S111 to S112.

Step S02: under the illumination of the exposure light source, imaging the mask pattern by the surface plasmon super-resolution photolithography system, and obtaining the electric field distribution E(x, y) and light intensity distribution I(x, y) of the spatial image on the photoresist layer according to the first mask data. At the same time, the first structural vector electric field distribution E(x', y') in the mask region is obtained, which is equivalent to the above operation S12.

The present disclosure is applicable to the optimization of any integrated circuit mask patterns. For complex circuit patterns, unpolarized light source is needed to be used as the excitation source of the forward simulation, which is approximately the superposition of two incoherent transverse magnetic (TM) and transverse electric (TE) polarized plane waves, so that the light intensity of the spatial image in the photoresist layer is $$I(x, y) = \frac{1}{2}(|E_{TE}(x, y)|^2 + |E_{TM}(x, y)|^2).$$

Step S03: obtaining a binary exposure transfer pattern through the photoresist model and outputting the photoresist pattern, and calculating the imaging error between the output photoresist pattern and the target pattern, which is equivalent to the above operations S131 to S132.

The present disclosure is applicable to any photoresist model, in which the input is the light intensity distribution of the spatial image in the photoresist and the output is the photoresist pattern after exposure and development. Here, the constant threshold model is adopted, which is mainly approximated by the Sigmod function, and the discrete constant threshold model is changed into continuous, which is convenient for the subsequent optimization steps. Then the photoresist model is $$Sig(I(x, y)) = \frac{1}{1 + e^{-a(I(x,y)tr)}},$$

where a is the photoresist factor and tr is the photoresist photosensitive threshold, and the output photoresist pattern is Z(x, y)=Sig(I(x, y)).

Step S04: evaluating the imaging quality of the mask pattern by using a pattern error function in the present disclosure, which defines the square of the L-2 norm of the difference between the target pattern and the photoresist pattern output by the mask, that is $F=\|Z-Z_d\|_2^2$, where $Z_d$ is the target pattern, Z is the photoresist pattern correspondingly output by the current mask pattern, F is the imaging error, and $\|\bullet\|_2$ represents the L-2 norm, which is equivalent to the aforementioned operation S133.

If the current calculated imaging error is less than the preset error threshold, or the current cumulative number of iterations is greater than the preset number of iterations, skip to step S09, otherwise, go to step S05.

Step S05: on the basis of forward simulation, performing adjoint simulation on the mask pattern M (x, y) (corresponding to the first mask data) to obtain the second structural vector electric field of adjoint simulation, wherein the adjoint source of the adjoint simulation may be intuitively understood as performing inverse transmission on the conjugate field of the expected output field, and the photoresist imaging monitor is replaced with the adjoint source, which is equivalent to the aforementioned operation S14.

According to the electric field distribution of the forward simulation spatial image, the adjoint sources a $\cdot(Z-Z_d)\cdot Z\cdot(1-Z)\cdot E_{TE}^*$ and a$\cdot(Z-Z_d)\cdot Z\cdot(1-Z)\cdot E_{TM}^*$ under TE and TM polarization are obtained respectively, where * represents complex conjugation. The rigorous electromagnetic calculation of FDTD is still used in the adjoint simulation, and the second structural vector electric field distribution $E^A(x', y')$ in the mask area is obtained by monitoring.

Step S06: The optimization process of the mask may be regarded as a process in which the topological structure of its boundary pattern is constantly evolved, and the optimized mask pattern M and the level set function $\phi$ are described as follows:

$$\phi(x, y) = \begin{cases} -d(x, y), & x, y \in M^- \\ 0, & x, y \in \partial M \\ d(x, y), & x, y \in M^+ \end{cases}$$

wherein d (x, y) represents a distance from a certain point (x, y) on the mask pattern to a boundary of the mask pattern, $M^-$ represents an area inside the mask pattern M, $\partial M$ represents the boundary of the mask pattern M, and M⁺ represents an area outside the mask pattern M, wherein the mask pattern M is the mask pattern, which is equivalent to the above operation S113.

Step S07: combining the first structural vector electric field E(x', y') of forward simulation in step S02 with the second structural vector electric field $E^A(x', y')$ of adjoint simulation in step S05, according to Maxwell boundary conditions, that is, the electric field is continuous in the tangential direction of the boundary and the electric displacement vector is continuous in the normal direction of the boundary, calculating the gradient of the imaging error F relative to the mask pattern M, that is, the level set gradient.

$$\frac{\partial F}{\partial M} = 2\text{Re}\left[(\varepsilon_2 - \varepsilon_1)E_\|(x', y')E_\|^A(x', y') + \left(\frac{1}{\varepsilon_1} - \frac{1}{\varepsilon_2}\right)D_\perp(x', y')D_\perp^A(x', y')\right]$$

wherein $\varepsilon_1$ and $\varepsilon_2$ are dielectric constants of the mask base material and a mask pattern structure filling material, respectively, $E_\|(x', y')$ and $E_\|^A(x, y')$ are tangential components of electric fields of forward simulation and adjoint simulation, respectively, $D_\perp(x', y')$ and $D_\perp^A(x', y')$ are normal components of forward simulation and adjoint simulation electric displacement vectors, respectively, which is equivalent to the aforementioned operation S15.

Step S08: updating the level set according to the level set evolution formula $$\frac{\partial \phi}{\partial t} = -\alpha \cdot |\nabla \phi|,$$

where α is the level set gradient obtained in step S07, that is $$\alpha = \frac{\partial F}{\partial M},$$

and the mask pattern M is the initial mask pattern or the mask pattern corresponding to the current mask data. Since the finite difference method is used for numerical solution, it is necessary to pay attention to the selection of time step, and the Courant-Friedrichs-Levy (CFL) condition Δt max (α(x, y))<h should be met when the grid interval h is given, so as to ensure the stability and convergence of the level set evolution, then the first mask data is updated, and the steps S02 to S08 are repeated and looped using the updated mask data (that is, the second mask data). Herein, the level set function used in S08 is the updated level set function obtained in the last iteration, until the imaging performance meets the requirement that the imaging error in step S04 is less than the preset error threshold or the current cumulative number of iterations is greater than the preset number of iterations.

Step S09: after the mask data meeting the preset conditions is obtained, completing the inverse optical proximity correction, and outputting the mask pattern corresponding to the current mask data optimized by the level set and the corresponding photoresist pattern.

The following is a description of specific embodiments.

Embodiment 1

As shown in FIG. 1, the surface plasmon super-resolution photolithography system in this embodiment includes a mask (quartz+Cr), an air spacer layer (Air), a metal layer (Ag), a photoresist (Pr), a metal reflective layer (Ag) and a substrate ($SiO_2$). In this embodiment, the thickness of the mask is 40 nm, the air spacer is 40 nm, the metal transmission layer is 20 nm, the metal reflection layer is 30 nm, and the thickness of the photoresist is 50 nm.

According to the adjoint algorithm, the level set gradient is obtained. After repeated loop iterations (steps S02 to S08), the level set is constantly evolved and the mask is constantly updated, and finally the optimized mask pattern is obtained. As shown in FIGS. 10, 1001 to 1006 are mask patterns for every 20 iterations.

In order to evaluate the performance of the present disclosure, the imaging results of the initial mask pattern and the mask pattern after optimization by the method of the present disclosure are compared respectively.

Figure 11:
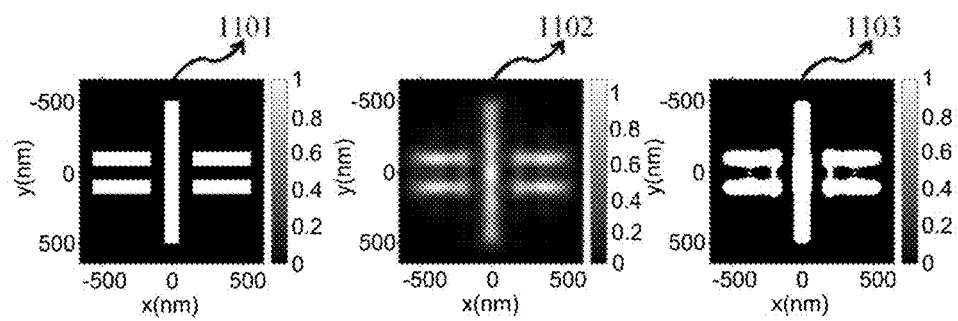
FIG. 11 schematically shows the imaging in an initial mask and its corresponding photoresist according to a specific embodiment of the present disclosure.
Figure 12:
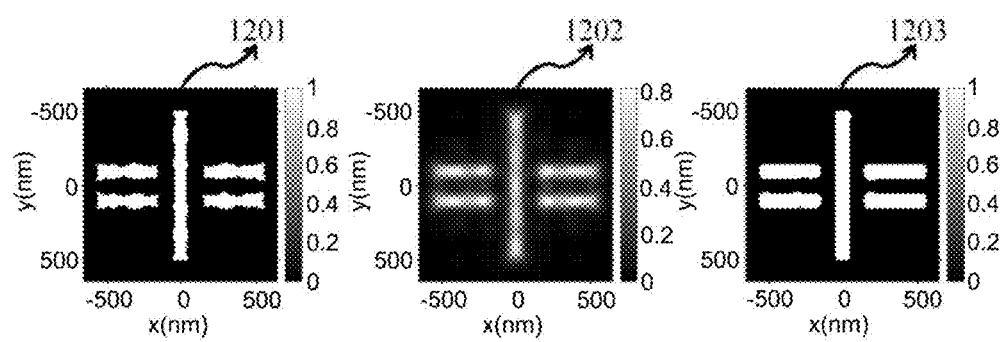
FIG. 12 schematically shows the imaging in an optimized mask and its corresponding photoresist according to a specific embodiment of the present disclosure.

FIG. 11 shows the imaging result before the optimization by the method of the present disclosure. 1101 is the initial mask pattern and the target pattern, in which the white area represents the transparent part and the black represents the opaque mask part, and the key feature size is 100 nm. 1102 is the light intensity distribution in the photoresist of the initial mask pattern after passing through the surface plasmon super-resolution photolithography system, and 1103 is the photoresist pattern output by the initial mask pattern, wherein the threshold value of the photoresist is 0.25. FIG. 12 shows the imaging result after optimization by the method of the present disclosure, 1201 is the mask pattern after optimization by the method of the present disclosure, 1202 is the light intensity distribution in the photoresist of the optimized mask pattern after passing through the surface plasmon super-resolution photolithography system, and 1203 is the photoresist pattern output by the optimized mask pattern, wherein the threshold of the photoresist is 0.25. The photoresist pattern before optimization has a bridging phenomenon, which affects the circuit performance. However, after the inverse OPC based on a level set algorithm, the output photoresist pattern is closer to the target pattern. At the same time, the function value of pattern error is also calculated. After optimizing the 1101 mask pattern by the method of the present disclosure, the function value of pattern error is reduced from 661 to 78.

Figure 13:
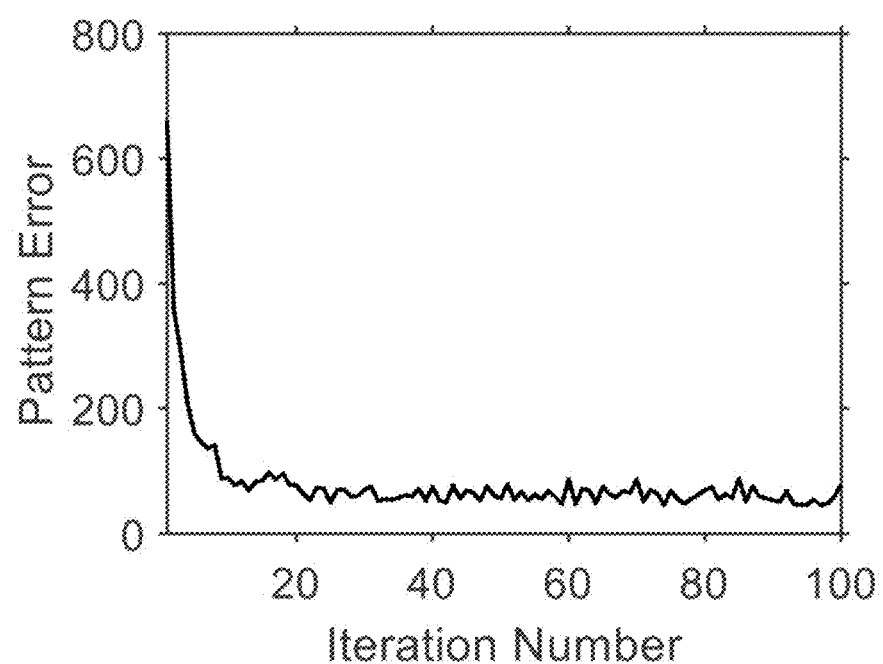
FIG. 13 schematically shows a convergence curve chart of a function value of pattern error according to a specific embodiment of the present disclosure.

In this embodiment, FIG. 13 shows a convergence curve of the function value of pattern error in optimization of the 1101 mask pattern by using the method of the present disclosure. In the method of the present disclosure, the function value of pattern error can converge to the optimal value in the first 30 iterations, and the function value of pattern error fluctuates in a very small range with the increase of iterations. Therefore, it shows that the method of the present disclosure can obtain an ideal optimization result only by dozens of times of optimization, which greatly improves the optimization efficiency.

Comparing FIG. 11 with FIG. 12, it can be seen that the method of the present disclosure has a good correction effect on the optical proximity effects in the surface plasmon super-resolution photolithography system. In this embodiment, rigorous electromagnetic calculation of FDTD is adopted, and the coupling effect between structures in the photolithography system is also considered, which can provide a relatively complete technical route for the inverse OPC of surface plasmon super-resolution photolithography.

Embodiment 2

Figure 14:
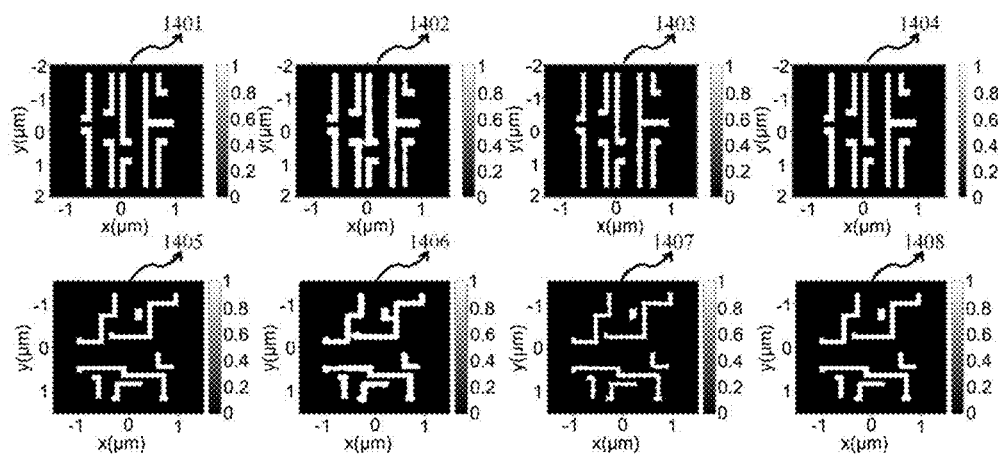
FIG. 14 schematically shows a schematic diagram of a mask and its corresponding photoresist pattern before and after optimizing a partial gate circuit diagram and a metal layer circuit diagram according to a specific embodiment of the present disclosure.

In order to further verify the correction effect of the method of the present disclosure on the actual circuit pattern, the super-resolution photolithography system is still as shown in FIG. 1. The mask pattern is a partial gate circuit diagram and a metal layer circuit diagram, and the key feature size is 100 nm. The imaging results before and after optimization by the method of the present disclosure are shown in FIG. 14. 1401 is the initial mask pattern of the partial gate circuit diagram, 1402 is the photoresist pattern output by 1401, 1403 is the mask pattern after optimization by using the method of the present disclosure, and 1404 is the photoresist pattern output by 1403. After optimization of 50 iterations, it is achieved that the function value of pattern error is reduced from 3333 to 180 by the adjoint algorithm-based level set inverse OPC. 1405 is the initial mask pattern of partial metal layer circuit diagram, 1406 is the photoresist pattern output by 1405, 1407 is the mask pattern after optimization by using the method of the present disclosure, and 1408 is the photoresist pattern output by 1407. After optimization of 50 iterations, it is achieved that the function value of pattern error is reduced from 2461 to 174 by the inverse OPC based on a level set algorithm. The method for OPC of surface plasmon super-resolution photolithography based on a level set algorithm of the present disclosure also has a good correction effect on the optical proximity effects of actual complex circuit patterns.

Figure 15:
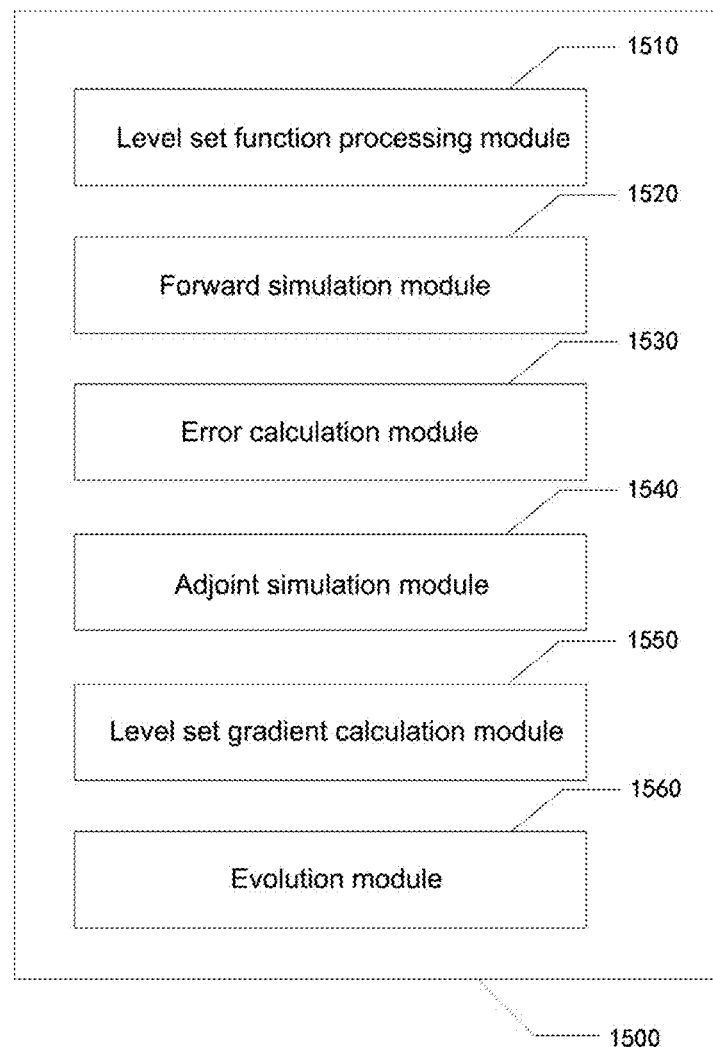
FIG. 15 schematically shows a block diagram of a system for inverse optical proximity correction of super-resolution photolithography based on a level set algorithm according to an embodiment of the present disclosure.

FIG. 15 schematically shows a block diagram of a system for inverse optical proximity correction of super-resolution photolithography based on a level set algorithm according to an embodiment of the present disclosure.

As shown in FIG. 15, FIG. 15 schematically shows a block diagram of a system for inverse optical proximity correction of super-resolution photolithography based on a level set algorithm according to an embodiment of the present disclosure. 1500 includes: a level set function processing module 1510, a forward simulation module 1520, an error calculation module 1530, an adjoint simulation module 1540, a level set gradient calculation module 1550, and an evolution module 1560.

The level set function processing module 1510 is configured for obtaining first mask data according to a target pattern, and constructing a level set function according to the first mask data.

According to an embodiment of the present disclosure, the level set function processing module 1510 may be, for example, configured to perform the S11 step described above with reference to FIG. 2, which will not be repeated here.

The forward simulation module 1520 is configured for performing forward simulation according to the first mask data and a condition of surface plasmon super-resolution photolithography to obtain electric field distribution on photoresist and first structural vector electric field distribution on a mask. According to an embodiment of the present disclosure, the forward simulation module 1520 may be, for example, configured to perform step S12 described above with reference to FIG. 2, which will not be repeated here.

The error calculation module 1530 is configured for obtaining a photoresist pattern according to the electric field distribution on the photoresist, and calculating an imaging error between the photoresist pattern and the target pattern. According to an embodiment of the present disclosure, the error calculation module 1530 may be, for example, configured to perform the S13 step described above with reference to FIG. 2, which will not be repeated here.

The adjoint simulation module 1540 is configured for performing adjoint simulation on the first mask data on the basis of the forward simulation to obtain a second structural vector electric field distribution. According to an embodiment of the present disclosure, the adjoint simulation module 1540 may be, for example, configured to perform step S14 described above with reference to FIG. 2, which will not be repeated here.

The level set gradient calculation module 1550 is configured for calculating a level set gradient according to the first structural vector electric field distribution, the second structural vector electric field distribution and the imaging error. According to an embodiment of the present disclosure, the level set gradient calculation module 1550 may be, for example, configured to perform step S15 described above with reference to FIG. 2, which will not be repeated here.

The evolution module 1560 is configured for evolving the level set function by using the level set gradient, and updating to obtain second mask data, and performing iterative calculation by using the second mask data until a mask data meeting a preset condition is obtained, thus completing the inverse optical proximity correction. According to an embodiment of the present disclosure, the evolution module 1560 may be, for example, configured to perform step S16 described above with reference to FIG. 2, which will not be repeated here.

It should be noted that any number of modules, sub-modules, units and sub-units according to the embodiments of the present disclosure, or at least some functions of any number of them may be implemented in one module. Any one or more of the modules, sub-modules, units and sub-units according to the embodiments of the present disclosure may be divided into a plurality of modules for implementation. Any one or more of the modules, sub-modules, units and sub-units according to the embodiments of the present disclosure may be at least partially implemented as a hardware circuit, such as a field programmable gate array (FPGA), a programmable logic array (PLA), a system-on-chip, a system-on-substrate, a system-on-package, an application specific integrated circuit (ASIC), or implemented by hardware or firmware that integrates or packages the circuit in any other reasonable way, or implemented by any one of the three implementations of software, hardware and firmware or by an appropriate combination of any of them. Alternatively, one or more of the modules, sub-modules, units, and sub-units according to the embodiments of the present disclosure may be at least partially implemented as a computer program module which, when run, can perform corresponding functions.

For example, any number of the level set function processing module 1510, the forward simulation module 1520, the error calculation module 1530, the adjoint simulation module 1540, the level set gradient calculation module 1550 and the evolution module 1560 may be combined and implemented in one module, or any one of them may be divided into a plurality of modules.

Alternatively, at least some functions of one or more of these modules may be combined with at least some functions of other modules and implemented in one module. According to an embodiment of the present disclosure, at least one of the level set function processing module 1510, the forward simulation module 1520, the error calculation module 1530, the adjoint simulation module 1540, the level set gradient calculation module 1550 and the evolution module 1560 may be at least partially implemented as a hardware circuit, such as a field programmable gate array (FPGA), a programmable logic array (PLA), a system-on-chip, a system-on-substrate, a system-on-package, an application specific integrated circuit (ASIC), or implemented by hardware or firmware that integrates or packages the circuit in any other reasonable way, or implemented by any one of the three implementations of software, hardware and firmware or by an appropriate combination of any of them. Alternatively, at least one of the level set function processing module 1510, the forward simulation module 1520, the error calculation module 1530, the adjoint simulation module 1540, the level set gradient calculation module 1550, and the evolution module 1560 may be at least partially implemented as a computer program module which, when run, can perform corresponding functions.

Figure 16:
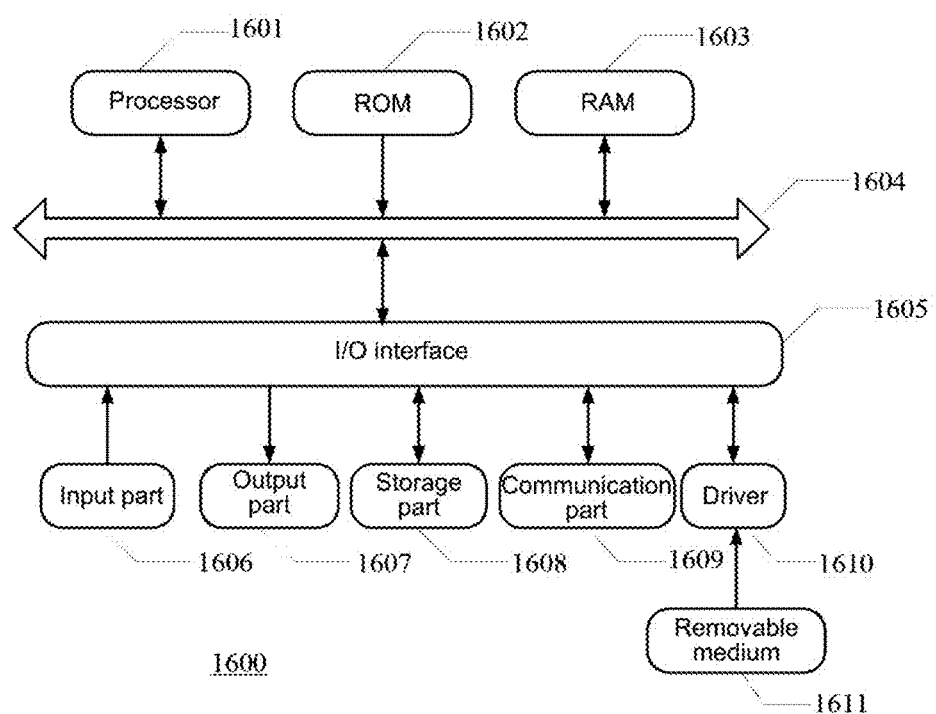
FIG. 16 schematically shows a block diagram of an electronic device suitable for implementing the method described above according to an embodiment of the present disclosure.

FIG. 16 schematically shows a block diagram of an electronic device suitable for implementing the method described above according to an embodiment of the present disclosure. The electronic device shown in FIG. 16 is just an example, and should not impose any limitation on the functionality and application scope of the embodiments of the present disclosure.

As shown in FIG. 16, the electronic device 1600 described in this embodiment includes a processor 1601 that can perform various appropriate actions and processes according to a program stored in a read-only memory (ROM) 1602 or a program loaded into a random access memory (RAM) 1603 from a storage part 1608. The processor 1601 may include, for example, a general-purpose microprocessor (such as a CPU), an instruction set processor and/or a related chipset and/or a special-purpose microprocessor (such as an application-specific integrated circuit (ASIC)), etc. The processor 1601 may further include an on-board memory for caching purposes. The processor 1601 may include a single processing unit or a plurality of processing units for performing different actions of a method flow according to the embodiments of the present disclosure.

In the RAM 1603, various programs and data required for the operation of the system 1600 are stored. A processor 1601, a ROM 1602 and a RAM 1603 are connected to each other through a bus 1604. The processor 1601 performs various operations of the method flow according to the embodiments of the present disclosure by executing programs in the ROM 1602 and/or the RAM 1603. It should be noted that the program may also be stored in one or more memories other than the ROM 1602 and the RAM 1603. The processor 1601 may also perform various operations of the method flow according to the embodiments of the present disclosure by executing programs stored in one or more memories.

According to an embodiment of the present disclosure, the electronic device 1600 may further include an input/output (I/O) interface 1605, which is also connected to the bus 1604. The system 1600 may further include one or more of the following components connected to the I/O interface 1605: an input part 1606 such as a keyboard, a mouse, etc.; an output part 1607 such as a cathode ray tube (CRT), a liquid crystal display (LCD), a speaker, etc.; a storage part 1608 such as a hard disk, etc.; and a communication part 1609 such as a network interface card such as a LAN card, a modem, etc. The communication part 1609 performs communication processing via a network such as the Internet. The driver 1610 is also connected to the I/O interface 1605 as needed. A removable medium 1611, such as a magnetic disk, an optical disk, a magneto-optical disk, a semiconductor memory, etc., is installed on the driver 1610 as needed, so that a computer program read therefrom can be installed into the storage part 1608 as needed.

According to an embodiment of the present disclosure, the method flow according to the embodiments of the present disclosure may be implemented as a computer software program. For example, an embodiment of the present disclosure includes a computer program product, which includes a computer program carried on a computer-readable storage medium, and the computer program contains program codes for performing the method shown in the flowchart. In such an embodiment, the computer program may be downloaded and installed from the network through the communication part 1609 and/or installed from the removable medium 1611. When the computer program is executed by the processor 1601, the above functions defined in the system of the embodiments of the present disclosure are performed. According to an embodiment of the present disclosure, the system, device, apparatus, module, unit, etc. described above may be implemented by a computer program module.

An embodiment of the present disclosure further provides a computer-readable storage medium, which may be included in the device/apparatus/system described in the above embodiments, and may also exist separately without being assembled into the device/apparatus/system. The computer-readable storage medium carries one or more programs, and when the one or more programs are executed, the method for inverse optical proximity correction of super-resolution photolithography based on a level set algorithm according to the embodiments of the present disclosure is implemented.

According to an embodiment of the present disclosure, the computer-readable storage medium may be a nonvolatile computer-readable storage medium, which may include, for example, but not limited to: a portable computer disk, a hard disk, a random access memory (RAM), a read-only memory (ROM), an erasable programmable read-only memory (EPROM or flash memory), a portable compact disk read-only memory (CD-ROM), an optical storage device, a magnetic storage device, or any suitable combination of the above. In an embodiment of the present disclosure, a computer-readable storage medium may be any tangible medium containing or storing a program, and the program may be used by or used in combination with an instruction execution system, apparatus or device. For example, according to an embodiment of the present disclosure, a computer-readable storage medium may include the ROM 1602 and/or the RAM 1603 described above, and/or one or more memories other than the ROM 1602 and the RAM 1603. An embodiment of the present disclosure further includes a computer program product, which includes a computer program containing program codes for performing the method shown in the flowchart. The program codes are configured for, when the computer program product is run in a computer system, making the computer system implement the method for inverse optical proximity correction of super-resolution photolithography based on a level set algorithm provided by the embodiments of the present disclosure.

When the computer program is executed by the processor 1601, the above functions defined in the system/apparatus of the embodiments of the present disclosure are performed. According to an embodiment of the present disclosure, the system, apparatus, module, unit, etc. described above may be implemented by a computer program module.

In an embodiment, the computer program may rely on a tangible storage medium such as an optical storage device and a magnetic storage device. In another embodiment, the computer program may also be transmitted and distributed in the form of signals on a network medium and downloaded and installed through the communication part 1609, and/or installed from the removable medium 1611. The program codes contained in the computer program may be transmitted by any suitable network medium, including but not limited to: a wireless network medium, a wired network medium, etc., or any suitable combination of the above.

In such an embodiment, the computer program may be downloaded and installed from the network through the communication part 1609 and/or installed from the removable medium 1611. When the computer program is executed by the processor 1601, the above functions defined in the system of the embodiments of the present disclosure are performed. According to an embodiment of the present disclosure, the system, device, apparatus, module, unit, etc. described above may be implemented by a computer program module.

According to an embodiment of the present disclosure, program codes for executing the computer program provided by the embodiments of the present disclosure may be written in any combination of one or more programming languages, and specifically, these computer programs may be implemented by using high-level procedural and/or object-oriented programming languages and/or assembly/machine languages. The programming languages include but are not limited to Java, C++, python, "C" or similar programming languages. The program codes may be completely executed on a user computing device, partially executed on a user device, partially executed on a remote computing device, or completely executed on a remote computing device or server. In the case involving a remote computing device, the remote computing device may be connected to a user computing device through any kind of network, including a local area network (LAN) or a wide area network (WAN), or may be connected to an external computing device (for example, through the Internet by using an Internet service provider).

It should be noted that each functional module in each embodiment of the present disclosure may be integrated into one processing module, or each module may physically exist separately, or two or more modules may be integrated into one module. The above integrated modules may be implemented in the form of hardware or software functional modules. The integrated modules may be stored in a computer-readable storage medium if they are implemented in the form of software functional modules and sold or used as independent products. Based on this understanding, the essential part of the technical solutions of the present disclosure or the part that has contributed to the prior art or all or part of the technical solutions may be embodied in the form of software products.

The flowcharts and block diagrams in the drawings illustrate the architectures, functions and operations of possible implementations of systems, methods and computer program products according to various embodiments of the present disclosure. In this regard, each block in the flowchart or block diagram may represent a module, a program segment or a part of codes, wherein the module, the program segment or the part of codes contains one or more executable instructions for implementing specified logical functions. It should also be noted that in some alternative implementations, the functions noted in the blocks may occur in a different order than those noted in the accompanying drawings. For example, two blocks shown in succession may actually be executed substantially in parallel, or may sometimes be executed in the inverse order, depending on the functions involved. It should also be noted that each block in the block diagram or flowchart, and combinations of blocks in the block diagram or flowchart, may be implemented by a dedicated hardware-based system that performs specified functions or operations, or may be implemented by a combination of dedicated hardware and computer instructions.

It can be understood by those skilled in the art that the features recorded in various embodiments and/or claims of the present disclosure may be combined and/or incorporated in various ways, even if such combinations or incorporations are not explicitly recorded in the present disclosure. In particular, feature recorded in various embodiments and/or claims of the present disclosure may be combined and/or incorporated in various ways without departing from the spirit and teaching of the present disclosure. All these combinations and/or incorporations shall fall within the scope of the present disclosure.

Although the present disclosure has been shown and described with reference to specific exemplary embodiments thereof, it will be understood by those skilled in the art that various changes in form and detail may be made without departing from the spirit and scope of the present disclosure as defined by the appended claims and their equivalents. Therefore, the scope of the present disclosure should not be limited to the above-mentioned embodiments, but should be determined not only by the appended claims, but also by the equivalents of the appended claims.

What is claimed is:

1. A method for inverse optical proximity correction of super-resolution photolithography based on a level set algorithm, comprising:
    S11, obtaining a first mask data according to a target pattern, and constructing a level set function according to the first mask data;
    S12, performing forward simulation according to the first mask data and a condition of surface plasmon super-resolution photolithography, to obtain electric field distribution on a photoresist and first structural vector electric field distribution on a mask;
    S13, obtaining a photoresist pattern according to the electric field distribution on the photoresist, and calculating an imaging error between the photoresist pattern and the target pattern;
    S14, performing adjoint simulation on the first mask data on the basis of the forward simulation to obtain a second structural vector electric field distribution;
    S15, calculating a level set gradient according to the first structural vector electric field distribution, the second structural vector electric field distribution and the imaging error; and
    S16, evolving the level set function by using the level set gradient, and updating to obtain a second mask data, and repeating S12 to S16 for iterative calculation by using the second mask data until a mask data meeting a preset condition is obtained, thus completing the inverse optical proximity correction.

2. The method for inverse optical proximity correction of super-resolution photolithography based on the level set algorithm according to claim 1, wherein obtaining a first mask data according to a target pattern and constructing a level set function according to the first mask data in S11 comprises steps of:
    obtaining an initial mask pattern according to the target pattern;
    performing pixelation processing on the initial mask pattern to obtain the first mask data; and
    constructing the level set function according to the first mask data.

3. The method for inverse optical proximity correction of super-resolution photolithography based on the level set algorithm according to claim 2, wherein the step of constructing the level set function according to the first mask data comprises:

constructing the level set function (x, y) by using the following formula:

$$\phi(x, y) = \begin{cases} -d(x, y), & x, y \in M^- \\ 0, & x, y \in \partial M \\ d(x, y), & x, y \in M^+ \end{cases}$$

wherein d(x, y) represents a distance from a certain point (x, y) on a mask pattern to a boundary of the mask pattern, x, y represent a coordinate value of a certain point, $M^-$ represents an area inside the mask pattern M, $\partial M$ represents the boundary of the mask pattern M, and $M^+$ represents an area outside the mask pattern M, the mask pattern M is the mask pattern corresponding to the first mask data.

4. The method for inverse optical proximity correction of super-resolution photolithography based on the level set algorithm according to claim 1, wherein performing forward simulation according to the first mask data and a condition of surface plasmon super-resolution photolithography in S12 comprises:

performing the forward simulation by using an exposure light source as an excitation source; and calculating the electric field distribution on the photoresist and the first structural vector electric field distribution on the mask.

5. The method for inverse optical proximity correction of super-resolution photolithography based on the level set algorithm according to claim 1, wherein calculating an imaging error between the photoresist pattern and the target pattern in S13 comprises:

obtaining a light intensity distribution according to the electric field distribution on the photoresist, and obtaining the photoresist pattern according to the light intensity distribution;

calculating the imaging error between the photoresist pattern and the target pattern; and determining whether the imaging error is less than a preset error threshold and whether a current cumulative number of iterations is greater than a preset number of iterations, wherein if the imaging error is less than the preset error threshold or the current cumulative number of iterations is greater than the preset number of iterations, a current mask data is the mask data meeting the preset condition, and the inverse optical proximity correction is completed; otherwise, the iterative calculation is continued.

6. The method for inverse optical proximity correction of super-resolution photolithography based on the level set algorithm according to claim 1 or 5, wherein calculating an imaging error between the photoresist pattern and the target pattern in S13 comprises:

calculating the imaging error F by using the following formula:

$$F = \|Z - Z_d\|_2^2$$

where $Z_d$ is the target pattern, Z is the photoresist pattern, and $\|\cdot\|_2$ represents a L-2 norm.

7. The method for inverse optical proximity correction of super-resolution photolithography based on the level set algorithm according to claim 5, wherein if the imaging error is less than the preset error threshold or the current cumulative number of iterations is greater than the preset number of iterations, the method further comprises:

taking the current mask data as the mask data for completing the inverse optical proximity correction, and outputting a final mask pattern.

8. The method for inverse optical proximity correction of super-resolution photolithography based on the level set algorithm according to claim 1, wherein performing adjoint simulation on the first mask data on the basis of the forward simulation in S14 comprises:

obtaining an adjoint source of the adjoint simulation according to the electric field distribution on the photoresist; and performing the adjoint simulation on the first mask data according to the adjoint source to obtain the second structural vector electric field distribution.

9. The method for inverse optical proximity correction of super-resolution photolithography based on the level set algorithm according to claim 6, wherein calculating a level set gradient according to the first structural vector electric field distribution, the second structural vector electric field distribution and the imaging error in S15 comprises: calculating the level set gradient $$\frac{\partial F}{\partial M}$$

by using the following formula:

$$\frac{\partial F}{\partial M} = 2\text{Re}\left[(\varepsilon_2 - \varepsilon_1)E_\|(x', y')E_\|^A(x', y') + \left(\frac{1}{\varepsilon_1} - \frac{1}{\varepsilon_2}\right)D_\perp(x', y')D_\perp^A(x', y')\right]$$

wherein $\varepsilon_1$ and $\varepsilon_2$ are dielectric constants of a mask base material and a mask pattern structure filling material, respectively, $E_\|(x', y')$ and $E_\|^A(x', y')$ are tangential components of electric fields of the forward simulation and the adjoint simulation, respectively, D (x', y') and D (x', y') are normal components of electric displacement vectors of the forward simulation and the adjoint simulation, respectively, and $$\frac{\partial F}{\partial M}$$

is a gradient of the imaging error F relative to the mask pattern M, the mask pattern M is the mask pattern corresponding to the first mask data or a current mask data.

10. The method for inverse optical proximity correction of super-resolution photolithography based on the level set algorithm according to claim 9, wherein evolving the level set function by using the level set gradient in S16 comprises:

evolving the level set function by using the following formula to obtain an updated level set function:

$$\frac{\partial \phi}{\partial t} = -\alpha \cdot |\nabla \phi|$$

wherein $$\alpha = \frac{\partial F}{\partial M},$$

and α is the level set gradient;

updating the current mask data to obtain the second mask data according to the updated level set function; and repeating S12 to S16 by using the second mask data for iterative calculation, wherein the level set function used in S16 is the updated level set function obtained in the last iteration.

11. A computer-readable storage medium, storing a computer program thereon, wherein the computer program, when executed by a processor, implements the method for inverse optical proximity correction of super-resolution photolithography based on the level set algorithm according to claim 1.

12. A system for inverse optical proximity correction of super-resolution photolithography based on a level set algorithm, comprising:

a level set function processing module, configured for obtaining a first mask data according to a target pattern, and constructing a level set function according to the first mask data;

a forward simulation module, configured for performing forward simulation according to the first mask data and a condition of surface plasmon super-resolution photolithography to obtain electric field distribution on a photoresist and first structural vector electric field distribution on a mask;

an error calculation module, configured for obtaining a photoresist pattern according to the electric field distribution on the photoresist, and calculating an imaging error between the photoresist pattern and the target pattern;

an adjoint simulation module, configured for performing adjoint simulation on the first mask data on the basis of the forward simulation to obtain a second structural vector electric field distribution;

a level set gradient calculation module, configured for calculating a level set gradient according to the first structural vector electric field distribution, the second structural vector electric field distribution and the imaging error; and an evolution module, configured for evolving the level set function by using the level set gradient, and updating to obtain a second mask data, and performing iterative calculation by using the second mask data until a mask data meeting a preset condition is obtained, thus completing the inverse optical proximity correction.

* * * * *